US012575261B2

(12) United States Patent
Ma

(10) Patent No.: US 12,575,261 B2
(45) Date of Patent: Mar. 10, 2026

(54) DISPLAY PANELS AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventor: Liang Ma, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 409 days.

(21) Appl. No.: 18/263,198

(22) PCT Filed: Jun. 14, 2023

(86) PCT No.: PCT/CN2023/100147
§ 371 (c)(1),
(2) Date: Jul. 27, 2023

(87) PCT Pub. No.: WO2024/250316
PCT Pub. Date: Dec. 12, 2024

(65) Prior Publication Data
US 2025/0089451 A1 Mar. 13, 2025

(30) Foreign Application Priority Data
Jun. 9, 2023 (CN) ........................ 202310688112.X

(51) Int. Cl.
*H10K 59/121* (2023.01)
*H10K 59/35* (2023.01)
*H10K 102/10* (2023.01)

(52) U.S. Cl.
CPC ......... *H10K 59/121* (2023.02); *H10K 59/353* (2023.02); *H10K 2102/10* (2023.02)

(58) Field of Classification Search
CPC ............... H10K 59/121; H10K 59/353; H10K 2102/10; H10K 59/352; H10K 59/65;
(Continued)

(56) References Cited

U.S. PATENT DOCUMENTS

2021/0408151 A1 12/2021 Choi et al.
2022/0115454 A1 4/2022 Ko et al.

FOREIGN PATENT DOCUMENTS

CN 110729332 A 1/2020
CN 110914891 A * 3/2020 ........... G09G 3/3258
(Continued)

OTHER PUBLICATIONS

English Machine Translation of Wang et al, CN 110914891 (Year: 2025).*
(Continued)

*Primary Examiner* — Donald L Raleigh
(74) *Attorney, Agent, or Firm* — PV IP PC; Wei Te Chung

(57) ABSTRACT

Display panels and display devices are provided. The display panel includes a first display area having a high light transmittance and a second display area having a low light transmittance. A light-emitting layer of the display panel includes first subpixels and second subpixels. In the first display area and the second display area having the same area, a number of the first subpixels located in the first display area is less than a number of the first subpixels located in the second display area, and a number of the second subpixels located in the first display area is equal to a number of the second subpixels located in the second display area.

20 Claims, 8 Drawing Sheets

(58) Field of Classification Search
CPC ...... H10K 59/12; H10K 59/122; H10K 59/35;
G09F 9/335
See application file for complete search history.

(56) References Cited

FOREIGN PATENT DOCUMENTS

| | | |
|----|-------------|--------|
| CN | 113066847 A | 7/2021 |
| CN | 113380190 A | 9/2021 |

OTHER PUBLICATIONS

Chinese Office Action issued in corresponding Chinese Patent Application No. 202310688112.X dated Nov. 1, 2024, pp. 1-9.
International Search Report in International application No. PCT/CN2023/100147, mailed on Feb. 9, 2024.
Written Opinion of the International Search Authority in International application No. PCT/CN2023/100147, mailed on Feb. 9, 2024.

* cited by examiner

DISPLAY PANELS AND DISPLAY DEVICES

CROSS-REFERENCE TO RELATED APPLICATION

This application is a national stage of International Application No. PCT/CN2023/100147, filed on Jun. 14, 2023, which claims priority to Chinese Patent Application No. 202310688112.X, filed on Jun. 9, 2023. The aforementioned applications are herein incorporated by references in their entireties.

TECHNICAL FIELD

The present disclosure relates to the field of display technologies, and in particular, to display panels and display devices.

BACKGROUND

The camera under panel (CUP) technology is being developed by major manufacturers because it may realize the full display of organic light-emitting diode (OLED) screens.

A CUP drive architecture in a common display panel is illustrated in FIG. 1. The display panel 1' includes a CUP area 2' and a display area 3' arranged around the CUP area 2'. The CUP area includes a high-transparency area (i.e., a camera area) 2a' and a transition area 2b' arranged around the high-transparency area 2a'. The CUP drive architecture is mainly to improve a visible light transmittance of the high-transparency area 2a' by disposing OLED display units (that is, the subpixels) 4' in the high-transparency area 2a' and disposing driving circuits 5' outside the high-transparency area 2a' (such as the transition area 2b'). The driving circuits 5' are electrically connected with the OLED display units 4' through transparent wirings 6', thereby realizing the display of the high-transparency area 2a'.

Because there is an opaque area such as an anode (ANO) of the OLED display unit in the high-transparency area, visible light diffraction will occur in the high-transparency area, thereby reducing the imaging quality of the camera under the panel.

SUMMARY OF THE INVENTION

The present disclosure provides display panels and display devices, which can effectively reduce the diffraction effect of the first display area, thereby improving the imaging quality of the camera under the panel.

In a first aspect, the present disclosure provides a display panel, including a first display area and a second display area arranged adjacently; a light transmittance of the first display area is greater than a light transmittance of the second display area; and the display panel further includes:

a substrate; and a light-emitting layer, arranged on a side of the substrate, and including a plurality of first subpixels displaying a first color and a plurality of second subpixels displaying a second color, herein the first display area includes a plurality of first sub-display areas, the second display area includes a plurality of second sub-display areas, and the first sub-display areas and the second sub-display areas are congruent; a number of the first subpixels located in the first sub-display areas is less than a number of the first subpixels located in the second sub-display areas, an area of each of the first subpixels located in the first sub-display areas is greater than an area of each of the first subpixels located in the second sub-display areas; and a number of the second subpixels located in the first sub-display areas is equal to a number of the second subpixels located in the second sub-display areas.

In the display panel provided in the present disclosure, an area of each of the second subpixels located in the first sub-display areas is less than or equal to an area of each of the second subpixels located in the second sub-display areas.

In the display panel provided in the present disclosure, the light-emitting layer further includes a plurality of third subpixels displaying a third color, a number of the third subpixels located in the first sub-display areas is equal to a number of the third subpixels located in the second sub-display areas, and an area of each of the third subpixels located in the first sub-display areas is less than or equal to an area of each of the third subpixels located in the second sub-display areas.

In the display panel provided in the present disclosure, a total area of all of the first subpixels located in the first sub-display areas is equal to a total area of all of the first subpixels located in the second sub-display areas.

In the display panel provided in the present disclosure, central points of the first subpixels are arranged along a first direction and a second direction in the first display area and the second display area, the first direction and the second direction cross each other, and central points of the second subpixels are arranged along the first direction and the second direction in the first display area and the second display area; and herein in the first direction, a distance between the center points of two adjacent ones of the first subpixels located in the first display area is greater than a distance between the center points of two adjacent ones of the first subpixels located in the second display area, and a distance between the center points of two adjacent ones of the second subpixels located in the first display area is equal to a distance between the center points of two adjacent ones of the second subpixels located in the second display area.

In the display panel provided in the present disclosure, in the second direction, a distance between the center points of two adjacent ones of the first subpixels located in the first display area is greater than or equal to a distance between the center points of two adjacent ones of the first subpixels located in the second display area, and a distance between the center points of two adjacent ones of the second subpixels located in the first display area is equal to a distance between the center points of two adjacent ones of the second subpixels located in the second display area.

In the display panel provided in the present disclosure, in the first direction, a ratio of the distance between the center points of two adjacent ones of the first subpixels located in the first display area to the distance between the center points of two adjacent ones of the first subpixels located in the second display area is 2; and in the second direction, a ratio of the distance between the center points of two adjacent ones of the first subpixels located in the first display area to the distance between the center points of two adjacent ones of the first subpixels located in the second display area is 2 or 1.

In the display panel provided in the present disclosure, the light-emitting layer further includes a plurality of third subpixels displaying a third color, and central points of the third subpixels are arranged along a first direction and a second direction in the first display area and the second display area;

in the first direction, a distance between the center points of two adjacent ones of the third subpixels located in the first display area is equal to a distance between the center points of two adjacent ones of the third subpixels located in the second display area; and in the second direction, a distance between the center points of two adjacent ones of the third subpixels located in the first display area is equal to a distance between the center points of two adjacent ones of the third subpixels located in the second display area.

In the display panel provided in the present disclosure, in the first display area, the first subpixels, the second subpixels, and the third subpixels are arranged according to arrangements of REAL RGB; and in the second display area, the first subpixels, the second subpixels, and the third subpixels are arranged in a subpixel rendering (SPR) mode.

In the display panel provided in the present disclosure, each of the first subpixels includes a green subpixel, each of the second subpixels includes a red subpixel or a blue subpixel, and each of the third subpixels includes a red subpixel or the blue subpixel that is different from the second subpixels.

In the display panel provided in the present disclosure, the display panel further include a driving circuit layer arranged between the substrate and the light-emitting layer, the first display area further include a transition area adjacent to the first sub-display areas; and the driving circuit layer includes first driving circuits, second driving circuits, and third driving circuits arranged in the transition area, the first driving circuits are electrically connected to the first subpixels located in the first display area, the second driving circuits are electrically connected to the second subpixels located in the first display area, and the third driving circuits are electrically connected to the third subpixels located in first display area.

In the display panel provided in the present disclosure, in the first display area, each of the first sub-display areas is provided with a minimum subpixel repeating unit therein, and the minimum subpixel repeating unit includes two first subpixels of the first subpixels, two second subpixels of the second subpixels, and two third subpixels of the third subpixels; and each of the first driving circuits is correspondingly and electrically connected to the two first subpixels of the minimum subpixel repeating unit, each of the second driving circuits is correspondingly and electrically connected to the two second subpixels of the minimum subpixel repeating unit, and each of the third driving circuits is correspondingly and electrically connected to the two third subpixels of the minimum subpixel repeating unit.

In a second aspect, the present disclosure also provides a display device, including a photosensitive device and a display panel; the display panel includes a first display area and a second display area arranged adjacently, and a light transmittance of the first display area is greater than a light transmittance of the second display area; the photosensitive device is arranged corresponding to the first display area; and the display panel further includes:

a substrate; and a light-emitting layer, arranged on a side of the substrate, and including a plurality of first subpixels displaying a first color and a plurality of second subpixels displaying a second color, herein the first display area includes a plurality of first sub-display areas, the second display area includes a plurality of second sub-display areas, and the first sub-display areas and the second sub-display areas are congruent; a number of the first subpixels located in the first sub-display areas is less than a number of the first subpixels located in the second sub-display areas, an area of each of the first subpixels located in the first sub-display areas is greater than an area of each of the first subpixels located in the second sub-display areas; and a number of the second subpixels located in the first sub-display areas is equal to a number of the second subpixels located in the second sub-display areas.

In the display device provided in the present disclosure, an area of each of the second subpixels located in the first sub-display areas is less than or equal to an area of each of the second subpixels located in the second sub-display areas.

In the display device provided in the present disclosure, the light-emitting layer further includes a plurality of third subpixels displaying a third color, a number of the third subpixels located in the first sub-display areas is equal to a number of the third subpixels located in the second sub-display areas, and an area of each of the third subpixels located in the first sub-display areas is less than or equal to an area of each of the third subpixels located in the second sub-display areas.

In the display device provided in the present disclosure, in the first display area, the first subpixels, the second subpixels, and the third subpixels are arranged according to arrangements of REAL RGB; and in the second display area, the first subpixels, the second subpixels, and the third subpixels are arranged in a SPR mode.

In the display device provided in the present disclosure, each of the first subpixels includes a green subpixel, each of the second subpixels includes a red subpixel or a blue subpixel, and each of the third subpixels includes a red subpixel or the blue subpixel that is different from the second subpixels.

In the display device provided in the present disclosure, the display panel further includes a driving circuit layer arranged between the substrate and the light-emitting layer; the first display area further includes a transition area adjacent to the first sub-display areas; and the driving circuit layer includes first driving circuits, second driving circuits, and third driving circuits arranged in the transition area, the first driving circuits are electrically connected to the first subpixels located in the first display area, the second driving circuits are electrically connected to the second subpixels located in the first display area, and the third driving circuits are electrically connected to the third subpixels located in first display area.

In the display device provided in the present disclosure, in the first display area, each of the first sub-display areas is provided with a minimum subpixel repeating unit therein, and the minimum subpixel repeating unit includes two first subpixels of the first subpixels, two second subpixels of the second subpixels, and two third subpixels of the third subpixels; and each of the first driving circuits is correspondingly and electrically connected to the two first subpixels of the minimum subpixel repeating unit, each of the second driving circuits is correspondingly and electrically connected to the two second subpixels of the minimum subpixel repeating unit, and each of the third driving circuits is correspondingly and electrically connected to the two third subpixels of the minimum subpixel repeating unit.

In the display device provided in the present disclosure, a total area of all of the first subpixels located in the first sub-display areas is equal to a total area of all of the first subpixels located in the second sub-display areas.

BENEFICIAL EFFECTS

Compared with the related art, in the display panels and display devices provided by the present disclosure, the light transmittance of the first display area is greater than the light transmittance of the second display area, and the first display area may be served as a CUP area. The first display area is divided into a plurality of first sub-display areas, the second display area is divided into a plurality of second sub-display areas, and the shapes and areas of the first sub-display area and the second sub-display area are the same. By reducing the number of the first subpixels in the first display area, the number of the first subpixels in the first sub-display area is less than the number of the first subpixels in the second sub-display area, which may effectively improve an area of a transparent area of the first display area, which is beneficial to reduce the diffraction effect of the first display area. In addition, by increasing the area of the first subpixel in the first display area, the area of the first subpixel located in the first sub-display area is greater than the area of the first subpixel in the second sub-display area, which is beneficial to ensure that the total area of the first subpixels in the first sub-display area is equivalent to the total area of the first subpixels in the second sub-display area, which is beneficial to ensure that the display effect of the first display area is not affected by the reduction in the number of the first subpixels. Therefore, the embodiments of the present disclosure may effectively reduce the diffraction effect of the first display area on the basis of ensuring the display effect of the first display area, thereby improving the imaging effect of the photosensitive device.

EMBODIMENTS OF THE INVENTION

Figure 1:
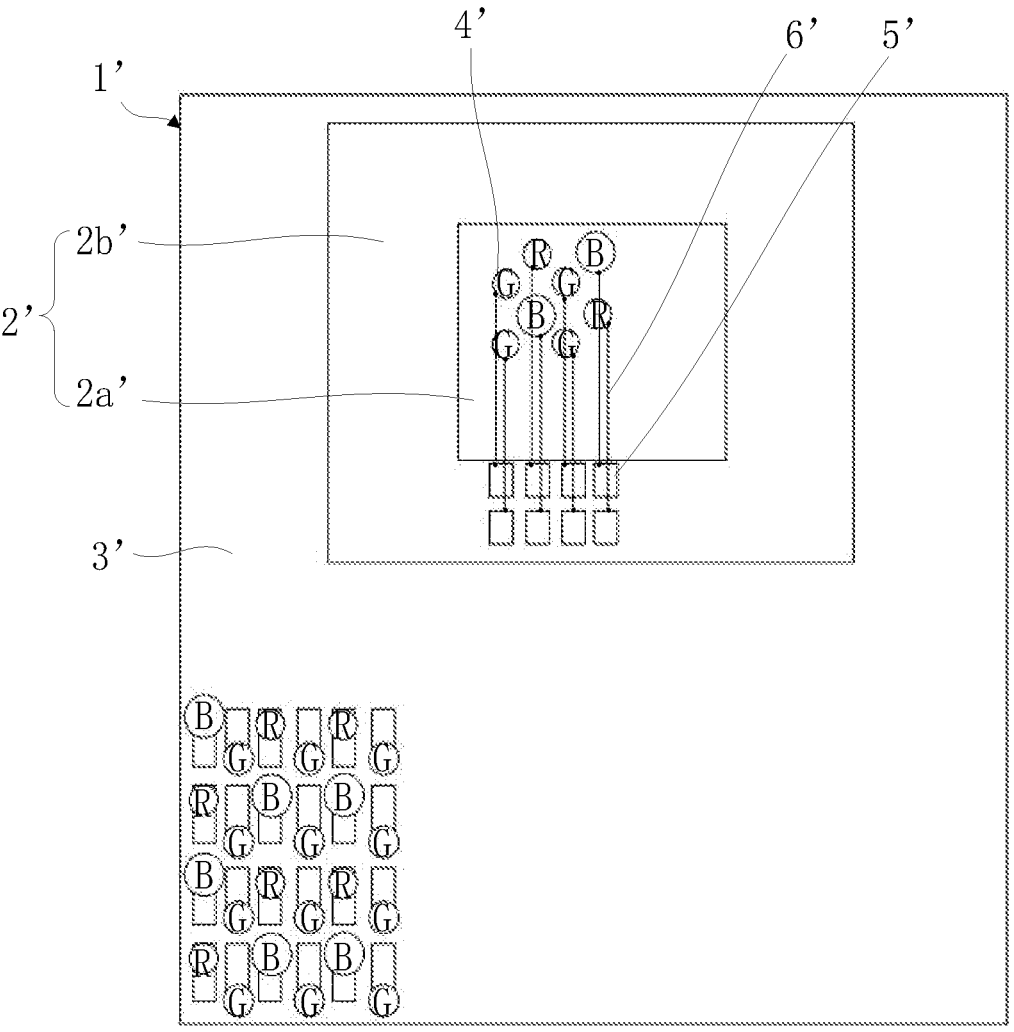
FIG. 1 is a schematic view of a partial structure of an exemplary display panel.

The technical solutions in the embodiments of the present disclosure will be clearly and completely described with reference to the accompanying drawings in the embodiments of the present disclosure. Obviously, the described embodiments merely indicate a part of the embodiments of the present disclosure, but not all the embodiments. Based on the embodiments in the present disclosure, all other embodiments obtained by those skilled in the art without creative work fall into the protection scope of the present disclosure.

In the description of the present disclosure, it should be understood that the terms "center", "longitudinal", "lateral", "length", "width", "thickness", "upper", "lower", "front", "rear", "left" "right", "vertical", "horizontal", "top", "bottom", "inside", "outside", "clockwise", "counterclockwise" etc. indicate orientations or positional relationships based on the orientation or positional relationships shown in the drawings, and are only for convenience of describing the present disclosure and simplifying the description, rather than indicating or implying the device or element referred to must have a specific orientation, be constructed and operated in a specific orientation, and therefore cannot be understood as a limitation of the present disclosure. Additionally, the terms "first", "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more than two, unless specifically defined otherwise.

In description of the present disclosure, unless otherwise specified and defined, terms "arranged", "connected", and "fixed" should be understood in a broad sense, for example, it may be a fixed connection, a detachable connection, or a whole; it may be a mechanical connection or an electrical connection; it may be a directly connection or an indirectly connection through an intermediate media; and it may be an internal communication of two components or an interaction relationship between two components. For those skilled in the art, meanings of the above terms in the present disclosure can be understood according to situations.

A number of different embodiments or examples are provided below for implementing different structures of the present disclosure. In order to simplify the disclosure, parts and arrangements of specific examples are described below. Of course, they are only examples and are not intended to restrict the present disclosure. In addition, the present disclosure may repeat reference numbers and/or reference letters in different examples for the purpose of simplicity and clarity and by itself does not indicate the relationships between the various embodiments and/or arrangements discussed. Additionally, examples of various specific processes and materials are provided in the present disclosure, but those skilled in the art may be aware of other processes and/or the use of other materials.

In related art, an arrangement of multiple red subpixels, multiple green subpixels, and multiple blue subpixels in the CUP area of the display panel is same with or similar to an arrangement of multiple red subpixels, multiple green subpixels, and multiple blue subpixels in the display area. For example, the red subpixels, the green pixels, and the blue subpixels in the CUP area and the display area are all arranged in a subpixel rendering (SPR) mode (for example, arranged according to an array of RGBG or according to an array of BGRG). However, for the existing pixel arrangement, the red subpixels, the green subpixels, and the blue subpixels include opaque structures which are densely arranged, so the diffraction of visible light is formed in the CUP area, resulting in poor imaging effect of the photosensitive device in the CUP area.

In order to solve the above technical problems, the present disclosure reduces the influence of diffraction effect on the imaging effect of the photosensitive device by optimizing the pixel arrangement in the CUP area under the premise of ensuring the display effect of the CUP area. The description of the following embodiments is referred for details.

Figure 2:
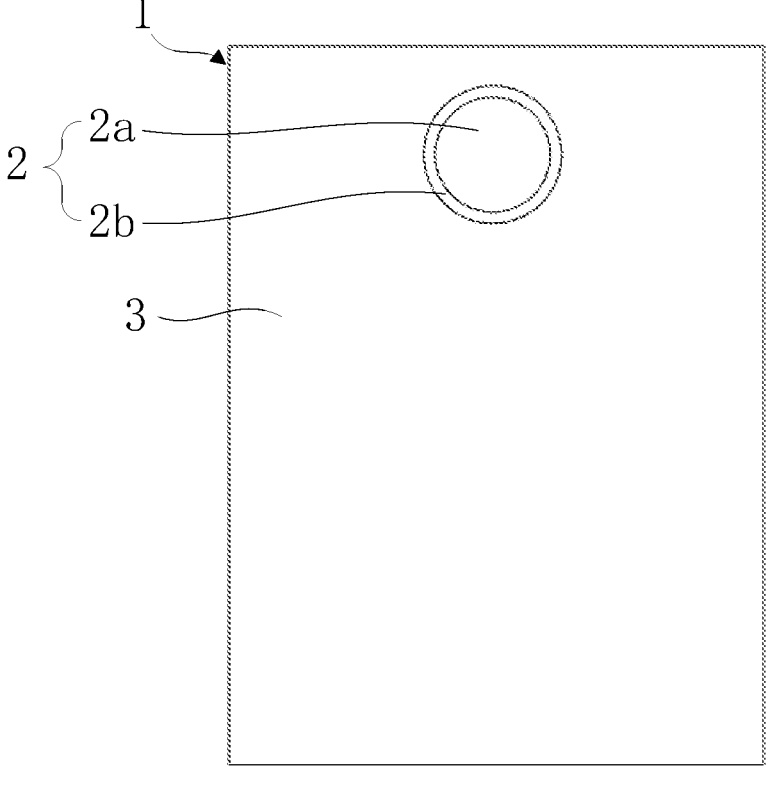
FIG. 2 is a top view of a display panel provided according to an embodiment of the present disclosure.
Figure 3:
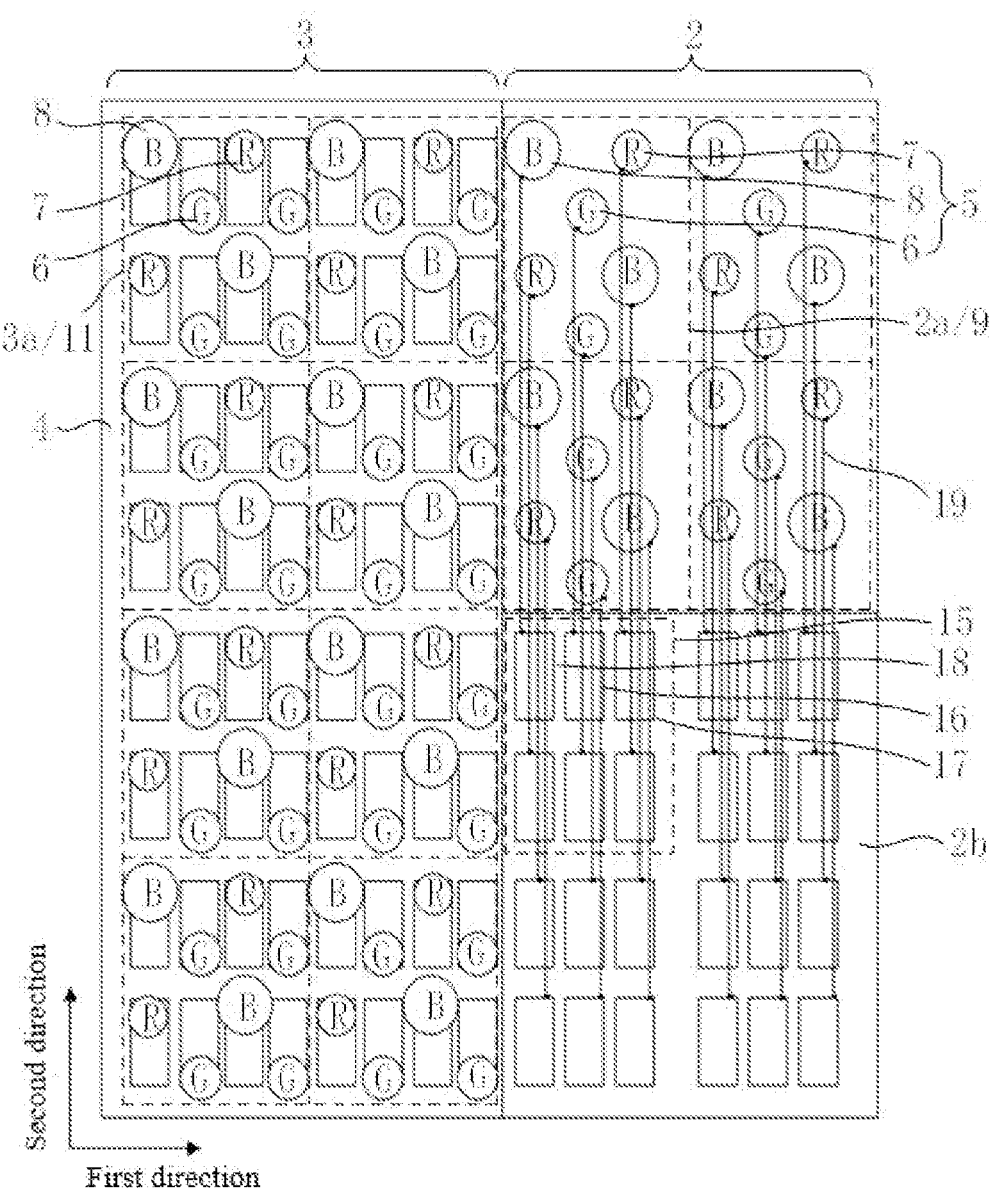
FIG. 3 is a schematic view of a partial structure of a first display area and a second display area of a display panel provided according to an embodiment of the present disclosure.

As illustrated in FIG. 2 and FIG. 3, a display panel 1 is provided according to embodiments of the present disclosure. The display panel 1 includes a first display area 2 and a second display area 3 arranged adjacently. A light transmittance of the first display area 2 is greater than a light transmittance of the second display area 3. The display panel 1 includes a substrate 4 and a light-emitting layer 5 arranged on a side of the substrate 4. The light-emitting layer 5 includes a plurality of first subpixels 6 displaying a first color and a plurality of second subpixels 7 displaying a second color. The first display area 2 includes a plurality of first sub-display areas 2a. The second display area 3 includes a plurality of second sub-display areas 3a. The first sub-display area 2a and the second sub-display area 3a have the same shape and the same area. A number of the first subpixels 6 located in the first sub-display area 2a is less than a number of the first subpixels 6 located in the second sub-display area 3a, and an area of each of the first subpixels 6 located in the first sub-display area 2a is greater than an area of each of the first subpixels 6 located in the second sub-display area 3a. A number of the second subpixels 7 located in the first sub-display area 2a is equal to a number of the second subpixels 7 located in the second sub-display area 3a.

Specifically, the first display area 2 of the display panel 1 is a CUP area, which is not only used for arranging the photosensitive device (such as the under-screen camera) to provide a lighting channel for the photosensitive device to realize a photosensitive function under the screen, but also used for displaying to realize a full screen display function.

Specifically, the plurality of first sub-display areas 2a are arranged along a first direction and a second direction, and the first direction and the second direction are arranged to cross each other. The plurality of second sub-display areas 3a are arranged along the first direction and the second direction. Embodiments of the present disclosure are described by taking the first direction as a horizontal direction and the second direction as a vertical direction as an example, but not limited thereto.

In a specific embodiment, a total area of all the first subpixels 6 located in the first sub-display area 2a is equal to a total area of all the first subpixels 6 in the second sub-display area 3a, but not limited thereto.

Compared with the related art, in the present disclosure, by reducing the number of the first subpixels 6 in the first display area 2, the number of the first subpixels 6 in the first sub-display area 2a is less than the number of the first subpixels 6 in the second sub-display having the same area, so that it may effectively increase an area of a light-transmitting area in the first display area 2, which is beneficial to reduce the diffraction effect of the first display area 2. Furthermore, on the basis that the number of the first subpixels 6 in each first sub-display area 2a is lesser, by increasing the area of a single first subpixel 6 located in the first display area 2, so that the area of the single first subpixel 6 located in the first subpixel 6 is greater than the area of the single first subpixel 6 in the second sub-display area 3a, which is beneficial to ensure that the total area of all the first subpixels 6 in the first sub-display area 2a is equal to the total area of the first subpixels 6 in the second sub-display area 3a, which is beneficial to ensure that the display effect of the first display area 2 is not affected by the reduction in the number of the first subpixels 6, that is, to ensure display brightness of the first display area 2 and the second display area 3 are consistent.

It should be noted that the area of the first subpixel 6, an area of the second subpixel 7, and an area of the third subpixel 8 mentioned below all refer to an area of a single subpixel.

Specifically, the area of the second subpixel 7 located in the first sub-display area 2a is less than or equal to the area of the second subpixel located in the second sub-display area 3a.

Since the number of the first subpixels 6 in each first sub-display area 2a of the first display area 2 is greater than the number of the first subpixels 6 in each second sub-display area 3a of the second display area 3, in order to avoid display unevenness in the first display area 2 and the second display area 3, it is necessary to increase the area of the first subpixel 6 in the first sub-display area 2a. On a condition that the area of the first subpixel 6 in the first sub-display area 2a increases by a small amount to meet the display requirement, the area of the second subpixel 7 in the first sub-display area 2a is equal to the area of the second subpixel 7 in the second sub-display area 3a, that is, there is no need to change the area of other subpixels in the first sub-display area 2a. On a condition that the area of the first subpixel 6 in the first sub-display area 2a increases greatly to meet the display requirement, the area of the second subpixel 7 in the first sub-display area 2a is less than the area of the second subpixel 7 in the second sub-display area 3a, that is, it is necessary to appropriately reduce the area of the second subpixel 7 in the first sub-display area 2a, so as to avoid other display problems caused by the large area of the first subpixel 6 in the first sub-display area 2a.

Specifically, as illustrated in FIG. 3, central points of the first subpixels 6 are arranged along the first direction and the second direction in the first display area 2 and the second display area 3; center points of the second subpixels 7 are arranged along the first direction and the second direction in the first display area 2 and the second display area 3.

In the first direction, a distance between the center points of two adjacent first subpixels 6 in the first display area 2 is greater than a distance between the center points of two adjacent first subpixels 6 in the second display area 3, and a distance between the center points of two adjacent second subpixels 7 in the first display area 2 is equal to a distance between the center points of two adjacent second subpixels 7 in the second display area 3.

In the second direction, a distance between the center points of two adjacent first subpixels 6 in the first display area 2 is equal to a distance between the center points of two adjacent first subpixels 6 in the second display area 3, and a distance between the center points of two adjacent second subpixels 7 in the first display area 2 is equal to a distance between the center points of two adjacent second subpixels 7 in the second display area 3.

It can be understood that the arrangement of the second subpixels 7 in the first display area 2 and the arrangement of the second subpixels 7 in the second display area 3 are consistent.

Specifically, only the number of the first subpixels 6 arranged in the first direction in the first display area 2 may be reduced, so that the distance between the center points of two adjacent first subpixels 6 arranged in the first direction and located in the first display area 2 is greater than the distance between the center points of two adjacent first subpixels 6 arranged in the first direction and located in the second display area 3, and the distance between the center points of the first subpixels 6 arranged in the second direction and located in the first display area 2 is equal to the distance between the center points of two adjacent first subpixels 6 arranged in the second direction and located in the second display area 3.

It should be noted that the reduction in the number of the first subpixels 6 in the first display area 2 is relative to the number of the first subpixels 6 in the second display area 3 having the same area with the first display area 2.

Specifically, as illustrated in FIG. 3, the light-emitting layer 5 further includes a plurality of third subpixels 8 displaying a third color. A number of the third subpixels 8 located in the first sub-display area 2a is equal to a number of the third subpixels 8 located in the second sub-display area. An area of each of the third subpixels 8 in the first sub-display area 2a is less than or equal to an area of each of the third subpixels 8 in the second sub-display area 3a. This design is also to balance the display brightness of the first display area 2 and the second display area 3, so as to avoid the problem of uneven brightness in the first display area 2 and the second display area 3.

Specifically, center points of the third subpixels 8 are arranged along the first direction and the second direction in both the first display area 2 and the second display area 3. In the first direction, a distance between the center points of two adjacent third subpixels 8 in the first display area 2 is equal to a distance between the center points of two adjacent third subpixels 8 in the second display area 3. In the second direction, a distance between the center points of two adjacent third subpixels 8 in the first display area 2 is equal to a distance between the center points of two adjacent third subpixels 8 in the second display area 3.

It can be understood that the arrangement of the third subpixels 8 in the first display area 2 and the arrangement of the third subpixels 8 in the second display area 3 are consistent.

Specifically, in the first display area 2, the first subpixel 6, the second subpixel 7, and the third subpixel 8 are arranged according to the arrangement of REAL RGB. In the second display area 3, the first subpixel 6, the second subpixel 7, and the third subpixel 8 are arranged in a SPR mode.

Specifically, the first subpixel 6 refers to a green subpixel (G), the second subpixel 7 refers to a red subpixel (R) or a blue subpixel (B), and the third subpixel 8 refers to a red subpixel or a blue subpixel that is different from the second subpixel 7.

In the embodiment of the present disclosure, that the first subpixel 6 is a green subpixel, the second subpixel 7 is a red subpixel, and the third subpixel 8 is a blue subpixel is taken as an example for illustration. It can be understood that the first subpixel 6 displays green (the first color), the second subpixel 7 displays red (the second color), and the third subpixel 8 displays blue (the third color).

Specifically, each of the first subpixel 6, the second subpixel 7, and the third subpixel 8 is composed of a light-emitting device. The light-emitting device includes an OLED device, but are not limited thereto.

Figure 4:
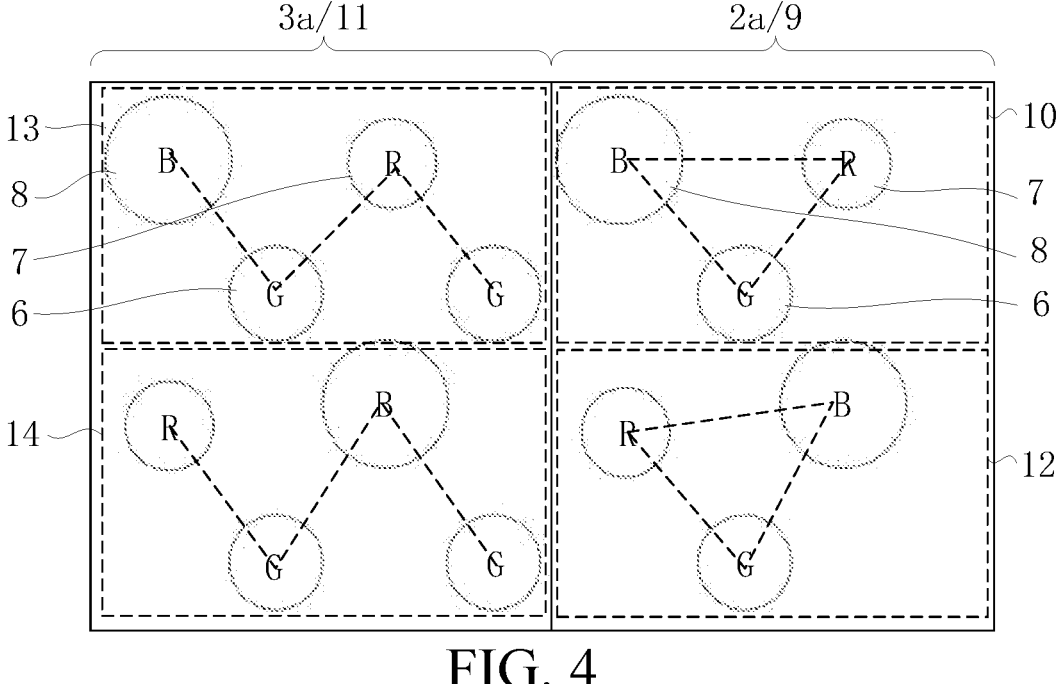
FIG. 4 is a schematic view of a pixel arrangement of a first pixel repeating unit and a second pixel repeating unit in FIG. 3.

Specifically, as illustrated in FIG. 3 and FIG. 4, the first display area 2 is divided into the plurality of first sub-display areas 2a. A minimum subpixel repeating unit, for example a first subpixel repeating unit 9, is formed within each first sub-display area 2a. The second display area 3 is divided into the plurality of second sub-display areas 3a. A minimum subpixel repeating unit, for example a second subpixel repeating unit 11, is formed within each second sub-display area 3a. The first subpixel repeating unit 9 includes at least one first subpixel 6, at least one second subpixel 7, and at least one third subpixel 8. The second subpixel repeating unit 11 includes at least two first subpixels 6, at least one second subpixel 7, and at least one third subpixel 8. A pixel arrangement of the first subpixel repeating unit 9 is same with a pixel arrangement of the second subpixel repeating unit 11 after at least one first subpixel 6 in the second subpixel repeating unit 11 is removed.

It can be understood that the first subpixel repeating unit 9 is repeatedly arranged in the first display area 2 along the first direction and the second direction, and the second subpixel repeating unit 11 is repeatedly arranged in the second display area 3 along the first direction and the second direction.

As illustrated in FIG. 3 and FIG. 4, the first pixel repeating unit 9 includes a first pixel unit 10 and a second pixel unit 12 arranged at intervals in the second direction. Each of the first pixel unit 10 and the second pixel unit 12 includes a green subpixel (G), a red subpixel (R), and a blue subpixel (B). The first pixel unit 10 is configured in a triangular arrangement of BGR, and the second pixel unit 12 is configured in a triangular arrangement of RGB.

It can be understood that an arrangement order of the red subpixel, the green subpixel, and the blue subpixel in the second pixel unit 12 is different from that in the first pixel unit 10. Since the first pixel unit 10 and the second pixel unit 12 are arranged in independent RGB triangles, the red subpixels, the green subpixels, and the blue subpixels in the entire first display area 2 are arranged according to the arrangement of REAL RBG.

It should be noted that the embodiments of the present disclosure do not limit the specific arrangement order of R, G, and B in the first pixel unit 10 and the second pixel unit 12. In the embodiments of the present disclosure, only that the first pixel unit 10 is configured as the triangular arrangement of BGR and the second pixel unit 12 is configured as the triangular arrangement of RGB will be taken as an example for illustration.

Specifically, the red subpixels, the green subpixels, and the blue subpixels in the first display area 2 are arranged according to the arrangements of REAL RGB, which may significantly increase an area of the transparent area in the first display area 2, which is beneficial to reduce the diffraction effect, which is beneficial to improve the imaging effect of the photosensitive device.

Specifically, in the first display area 2, a plurality of first pixel units 10 are arranged in multiple rows and multiple columns in the first direction and the second direction, and a plurality of second pixel units 12 are arranged in multiple rows and multiple columns in the first direction and the second direction. The first pixel units 10 and the second pixel units 12 in any two adjacent rows are arranged in one-to-one correspondence, and the first pixel units 10 and the second pixel units 12 in any two adjacent columns are arranged in one-to-one correspondence. This design makes the first pixel units 10 arranged in the triangle of BGR and the second pixel units 12 arranged in the triangle of BGR be evenly and regularly distributed in the first display area 2, which is beneficial to ensure the display effect of the first display area 2.

Specifically, as illustrated in FIG. 3 and FIG. 4, the second pixel repeating unit 11 includes a third pixel unit 13 and a fourth pixel unit 14 arranged at intervals in the second direction. Each of the third pixel unit 13 and the fourth pixel unit 14 includes a red subpixel, a blue subpixel, and two green subpixels. The third pixel unit 13 is configured in a saw-shaped arrangement of BGRG, and the fourth pixel unit 14 is configured in a saw-shaped arrangement of RGBG. It can be understood that the pixel arrangements of the third pixel unit 13 and the fourth pixel unit 14 make the red subpixels, the blue subpixels, and the green subpixels in the entire second display area 3 arranged in a SPR mode.

Specifically, the first pixel unit 10 is the same as a pixel unit obtained after removing the green subpixel at an end based on the arrangement of the third pixel unit 13, and the second pixel unit 12 is the same as a pixel unit obtained after removing the green subpixel at an end based on the arrangement of the fourth pixel unit 14. It can be understood that the numbers and arrangements of the red subpixels and the blue subpixels in the first pixel unit 10 and the third pixel unit 13 are consistent, and the numbers and arrangements of the red subpixels and the blue subpixels in the second pixel unit 12 and the fourth pixel unit 14 are consistent.

Specifically, in the second display area 3, a plurality of third pixel units 13 are arranged in multiple rows and multiple columns in the first direction and the second direction, and a plurality of fourth pixel units 14 are arranged in multiple rows and multiple columns in the first direction and the second direction. The third pixel units 13 and the fourth pixel units 14 in any two adjacent rows are arranged in one-to-one correspondence, and the third pixel units 13 and the fourth pixel units 14 in any two adjacent columns are in one-to-one correspondence. Therefore, the green subpixels in the plurality of second pixel repeating units 11 in the second display area 3 are arranged in multiple rows and multiple columns. In the second display area 3, the green subpixels in any two adjacent rows are arranged in one-to-one correspondence, the green subpixels in any two adjacent columns are arranged in one-to-one correspondence.

Since the first pixel unit 10 and the second pixel unit 12 are equivalent to the pixel units obtained after removing the green subpixels at the ends on the basis of the arrangements of the third pixel unit 13 and the fourth pixel unit 14, respectively, the pixel arrangement of the plurality of first pixel repeating units 9 in the first display area 2 may be obtained by removing an entire column at intervals of the multiple rows of the green subpixels in the plurality of second pixel repeating units 11 within the same area.

Specifically, in the first display area 2, the green subpixels in the plurality of first pixel repeating units 9 are arranged in multiple rows and multiple columns, the green subpixels in any adjacent two rows are arranged in one-to-one correspondence, and the green subpixels in any adjacent two columns are arranged in one-to-one correspondence. In the first direction, a ratio of a distance between center points of two adjacent green subpixels in the first display area 2 to a distance between center points of two adjacent green subpixels in the second display area 3 is 2. In the second direction, a ratio of a distance between center points of two adjacent green subpixels in the first display area 2 to a distance between center points of two adjacent green subpixels in the second display area 3 is 1.

Of course, in other embodiments, the first pixel repeating unit 9 may only include the first pixel unit 10 or the second pixel unit 12, and correspondingly, the second pixel repeating unit 11 includes the third pixel unit 13 or the fourth pixel unit 14. On a condition that the first pixel repeating unit 9 only includes the aforementioned first pixel unit 10 and the second pixel repeating unit 11 includes the aforementioned third pixel unit 13, the arrangement of the first pixel unit 10 is same as the pixel unit obtained after removing the green subpixel at the end based on the arrangement of the third pixel unit 13. On a condition that the first pixel repeating unit 9 only includes the aforementioned second pixel unit 12 and the second pixel repeating unit 11 includes the aforementioned fourth pixel unit 14, the arrangement of the second pixel unit 12 is same as the pixel unit obtained after removing the green subpixel at the end based on the arrangement of the fourth pixel unit 14.

Figure 5:
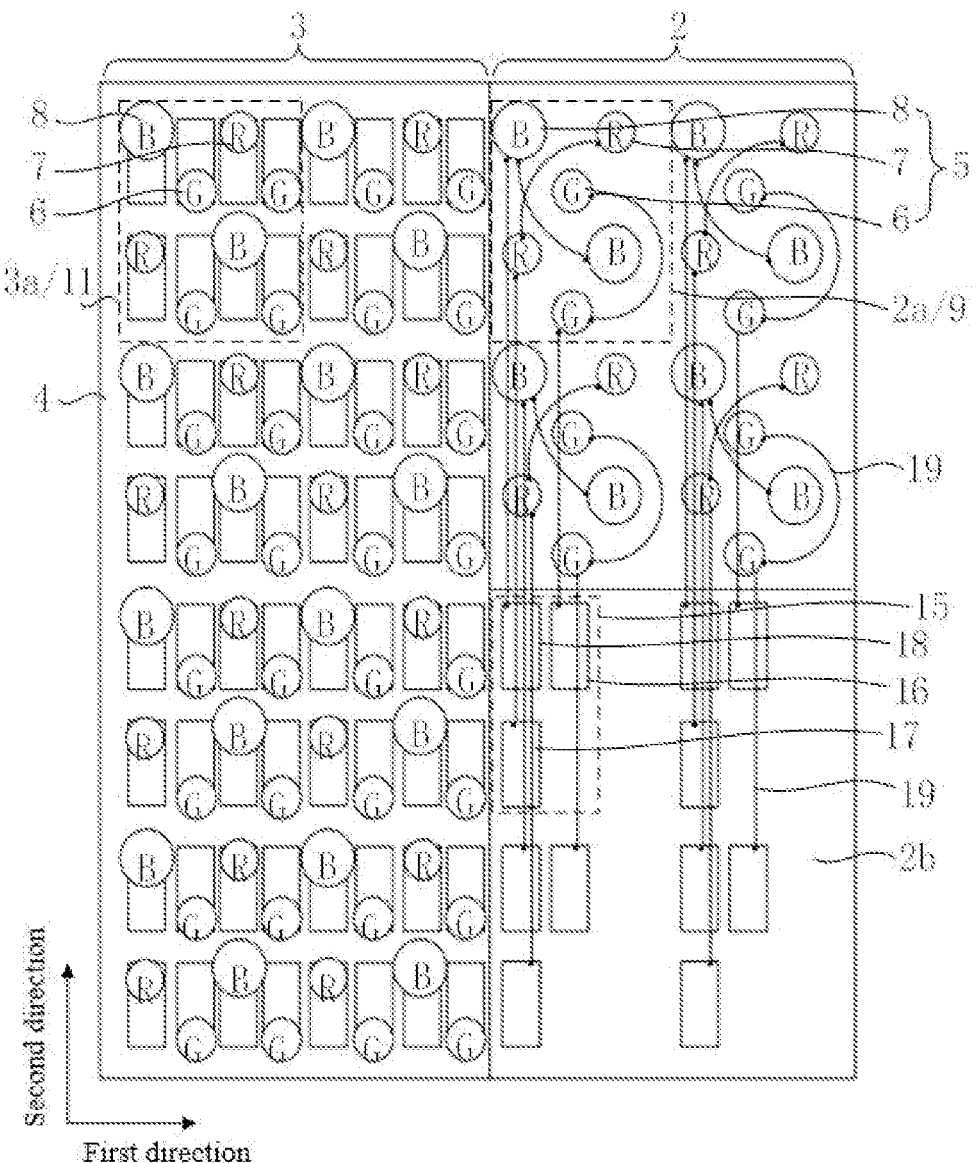
FIG. 5 is a schematic view of a partial structure of a first display area and a second display area of another display panel provided according to an embodiment of the present disclosure.

Specifically, as illustrated in FIG. 3 and FIG. 5, the first display area 2 further includes a transition area 2b adjacent to the first sub-display area 2a. The display panel 1 further includes a driving circuit layer arranged between the substrate 4 and the light-emitting layer 5. The driving circuit layer includes a plurality of driving circuit units 15 arranged in the transition area 2b and electrically connected to the plurality of first pixel repeating units 9 one by one. The driving circuit unit 15 includes at least one first driving circuit 16, at least one second driving circuit 17, and at least one third driving circuit 18.

The first driving circuit 16 is electrically connected to the first subpixel 6 in the corresponding first pixel repeating unit 9, the second driving circuit 17 is electrically connected to the second subpixel 7 in the corresponding first pixel repeating unit 9, and the third driving circuit 18 is electrically connected to the third subpixel 8 in the corresponding first pixel repeating unit 9.

Specifically, the first subpixel 6, the second subpixel 7, and the third subpixel 8 are all electrically connected to corresponding driving circuits through transparent wirings 19.

In a specific embodiment, as illustrated in FIG. 3, the number of the first subpixels 6 in each first pixel repeating unit 9 is equal to a number of the first driving circuits 16 in the corresponding driving circuit unit 15, and the number of the second subpixels 7 in each pixel repeating unit 9 is equal to a number of the second driving circuits 17 in the corresponding driving circuit unit 15, and the number of the third subpixels 8 in each first pixel repeating unit 9 is equal to a number of the third driving circuits 18 in the corresponding driving circuit unit 15. Each first driving circuit 16 is arranged corresponding to and electrically connected to one first subpixel 6, each second driving circuit 17 is arranged corresponding to and electrically connected to one second subpixel 7, and each third driving circuit 18 is arranged corresponding to and electrically connected to one third subpixel 8. It can be understood that the driving circuit in this embodiment adopts one-to-one driving mode.

In another specific embodiment, as illustrated in FIG. 5, the first pixel repeating unit 9 includes two first subpixels 6, two second subpixels 7, and two third subpixels 8; the driving circuit unit 15 includes a first driving circuit 16, a second driving circuit 17, and a third driving circuit 18; and one first driving circuit 16 is electrically connected to the two first subpixels 6 in the corresponding first pixel repeating unit 9, and one second driving circuit 17 is electrically connected to the two second subpixels 7 in the corresponding first pixel repeating unit 9, and one third driving circuit 18 is connected to the two third subpixels 8 in the corresponding first pixel repeating unit 9. It can be understood that the driving circuit in this embodiment adopts one-to-many driving mode, that is, each driving circuit may drive multiple subpixels displaying the same color.

It can be understood that the one-to-many driving mode may reduce the number of the driving circuits in each driving circuit unit 15, which is beneficial to optimize the wiring distribution in the transition area 2b and reduce the area of the transition area 2b.

It can be understood that the plurality of subpixels displaying the same color in the first pixel repeating unit 9 may also be connected by the transparent wirings 19.

Through the comparison of diffraction simulation experiments, it can be known that, compared with the related art, the intensity of a secondary diffraction peak in the first display area 2 of the display panel 1 provided according to the embodiments of the present disclosure is reduced, and the secondary diffraction peaks are relatively regular. That is to say, the diffraction effect in the first display area 2 of the display panel 1 provided according to the embodiments of the present disclosure is significantly reduced, which is beneficial to improve the influence of the diffraction effect on the imaging effect of the photosensitive device.

In the embodiments of the present disclosure, on the basis of the pixel arrangement of the third pixel units 13 and the fourth pixel units 14 in the second display area 3, the pixel units obtained by removing part of the first subpixels 6 (such as the green subpixels) are used as the first pixel units 10 and the second pixel units 12 in the first display area 2, so that the pixel arrangement in the first display area 2 is optimized. On the one hand, the number of the first subpixels 6 in the first sub-display area 2a is thus less than the number of the first subpixels 6 in the second sub-display area 3a having the same area as the first sub-display area 2a, which may effectively improve the area of the transparent area in the first display area and reduce the diffraction effect of the first display area. On the other hand, the first subpixel 6, the second subpixel 7, and the third subpixel 8 in the first display area are arranged in the arrangement of REAL RGB, which effectively improves the area of the light transparent area in the first display area 2 and reduces the diffraction effect of the first display area 2. On the other hand, the area of the first subpixel 6 located in the first sub-display area 2a is increased, so the area of the first subpixel 6 located in the first sub-display area 2a is greater than the area of the first subpixel 6 located in the second sub-display area 3a, which is beneficial to ensure that the total area of all the first subpixels 6 in the first sub-display area 2a is equated to the area of all the first subpixels 6 in the second sub-display area 3a having the same area with the first sub-display area 2a, which is beneficial to ensure that the display effect of the first display area 2 is not affected by the reduction in the number of the first subpixels 6. Therefore, the embodiments of the present disclosure may effectively reduce the diffraction effect of the first display area 2 on the basis of ensuring the display effect of the first display area 2, thereby improving the imaging effect of the photosensitive device.

Figure 6:
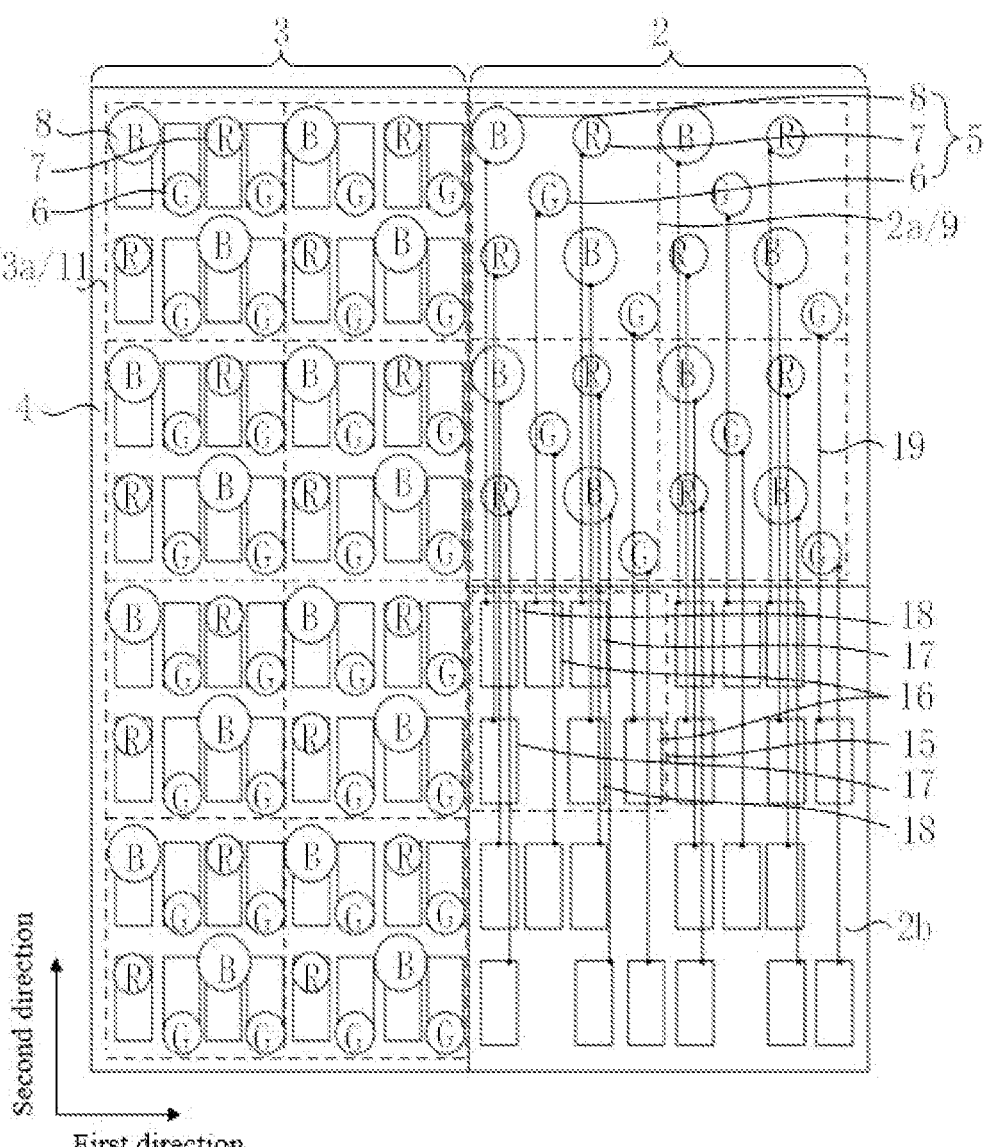
FIG. 6 is a schematic view of a partial structure of a first display area and a second display area of another display panel provided according to an embodiment of the present disclosure.
Figure 7:
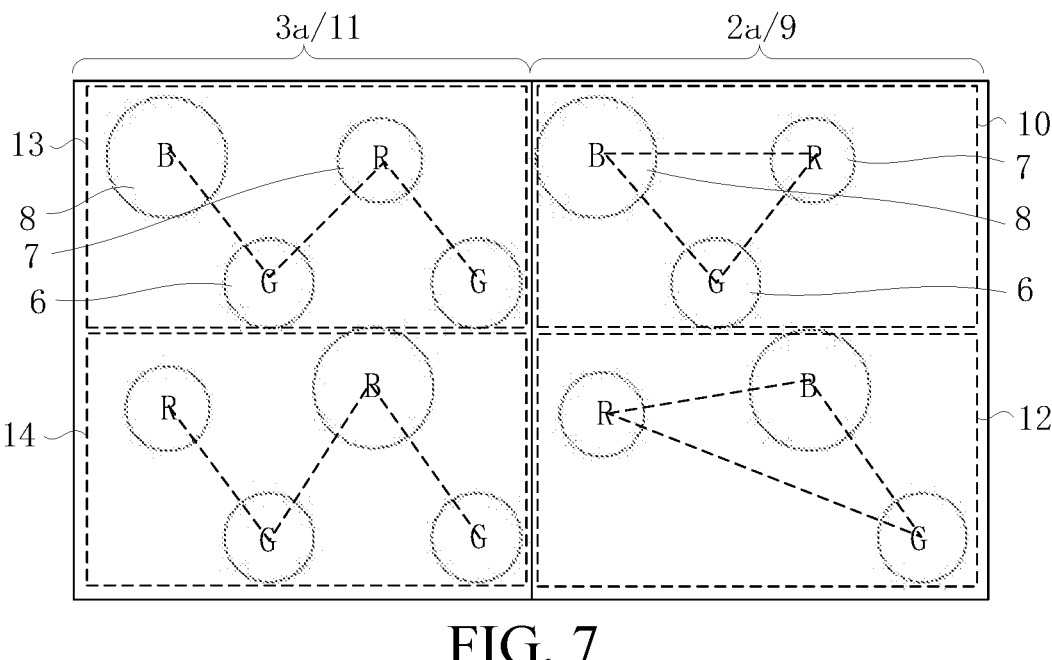
FIG. 7 is a schematic view of a pixel arrangement of a first pixel repeating unit and a second pixel repeating unit in FIG. 6.

As illustrated in FIG. 6 and FIG. 7, the embodiment of the present disclosure also provides a display panel, which is different from the foregoing embodiments in arrangement positions of the first subpixels 6 in the first display area 2, specifically reflected in the arrangement of the second pixel unit 12 of the first pixel repeating unit 9 of the display area 2.

In the embodiment of the present disclosure, in the first direction, the distance between the center points of two adjacent first subpixels 6 located in the first display area 2 is greater than the distance between the center points of two adjacent first subpixels 6 located in the second display area 3; the distance between the center points of two adjacent second subpixels 7 located in the first display area 2 is equal to the distance between the center points of two adjacent second subpixels 7 located in the second display area 3; and the distance between the center points of two adjacent third subpixels 8 located in the first display area 2 is equal to the distance between the center points of two adjacent third subpixels 8 located in the second display area 3.

Furthermore, in the second direction, the distance between the center points of two adjacent first subpixels 6 located in the first display area 2 is greater than the distance between the center points of two adjacent first subpixels 6 located in the second display area 3; the distance between the center points of two adjacent second subpixels 7 located in the first display area 2 is equal to the distance between the center points of two adjacent second subpixels 7 located in the second display area 3; and the distance between the center points of two adjacent third subpixels 8 located in the first display area 2 is equal to the distance between the center points of two adjacent third subpixels 8 located in the second display area 3.

It can be understood that the arrangements of the second subpixels 7 and the third subpixels 8 in the first display area 2 and the second display area 3 are consistent.

Specifically, the number of the first subpixels 6 arranged in the first direction in the first display area 2 may be reduced, and the number of the first subpixels 6 arranged in the second direction in the first display area 2 is reduced, so that the distance between the center points of two adjacent first subpixels 6 arranged in the first direction and located in the first display area 2 is greater than the distance between the center points of adjacent two first subpixels 6 arranged in the first direction and located in the second display area 3, and the distance between the center points of two adjacent first subpixels 6 arranged in the second direction and located in the first display area 2 is greater than the distance between the center points of adjacent two first subpixels 6 arranged in the second direction and located in the second display area 3.

It should be noted that, in the embodiment of the present disclosure, the first subpixel 6, the second subpixel 7, and the third subpixel 8 in the first display area 2 are still arranged in accordance with the arrangement of REAL RGB, and the first subpixel 6, the second subpixel 7, and the third subpixel 8 in the second display area 3 are still arranged in a SPR mode.

Specifically, as illustrated in FIG. 6 and FIG. 7, in the embodiment of the present disclosure, the structure of the second pixel repeating unit 11 in the second display area 3 remains unchanged and specifically includes the aforementioned third pixel unit 13 and the aforementioned fourth pixel unit 14. The third pixel unit 13 is configured in a saw-shaped arrangement of BGRG, and the fourth pixel unit 14 is configured in a saw-shaped arrangement of RGBG.

Specifically, as illustrated in FIG. 6 and FIG. 7, in the embodiment of the present disclosure, the structure of the first pixel unit 10 of the first pixel repeating unit 9 in the first display area 2 remains unchanged and is still configured as a triangle arrangement of BGR. Different from the afore-mentioned embodiments, the second pixel unit 12 of the first pixel repeating unit 9 in the first display area 2 is arranged in a triangular arrangement of RBG, and a shape of the triangular arrangement of RBG of the second pixel unit 12 is different from a shape of the triangular arrangement of BGR of the first pixel unit 10.

In the embodiment, the pixel unit obtained after removing the last green subpixel (G) in the third pixel unit 13 may be used as the first pixel unit 10, and the pixel unit obtained after removing the first green subpixel (G) in the fourth pixel unit 14 may serve as the second pixel unit 12.

Specifically, the green subpixels in the plurality of second pixel repeating units 11 in the second display area 3 are arranged in multiple rows and multiple columns, the green subpixels in any two adjacent rows are arranged in one-to-one correspondence, and the green subpixels in any adjacent two columns are arranged in one-to-one correspondence. The pixel arrangement of the plurality of first pixel repeating units 9 in the first display area 2 may be obtained by removing the green subpixels in the plurality of second pixel repeating units 11 within the same area in a single interlaced manner.

Specifically, in the first display area 2, the green subpixels in the plurality of first pixel repeating units 9 are arranged in multiple rows and multiple columns, the green subpixels in any two adjacent rows are alternately arranged sequentially, and the green subpixels in any two adjacent columns are sequentially arranged alternately. In the first direction, a ratio of a distance between center points of two adjacent green subpixels in the first display area 2 to a distance between center points of two adjacent green subpixels in the second display area 3 is 2. In the second direction, a ratio of a distance between center points of two adjacent green subpixels in the first display area 2 to a distance between center points of two adjacent green subpixels in the second display area 3 is 2.

Figure 8:
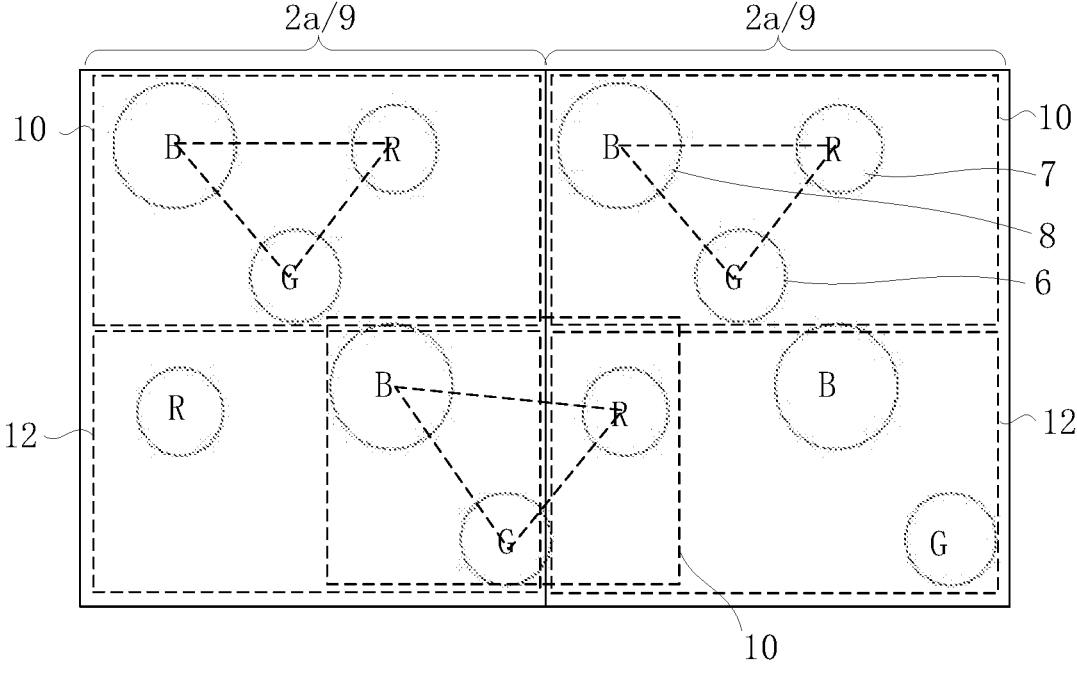
FIG. 8 is a schematic view of a pixel arrangement of two adjacent first pixel repeating units in a first direction in FIG. 6.

As illustrated in FIG. 6 and FIG. 8, in the first display area 2, three subpixels in any two adjacent second pixel units 12 in the first direction may also form one first pixel unit 10, so that the first display area 2 includes a plurality of first pixel units 10 arranged alternately. Therefore, for the entire first display area 2, a plurality of first pixel units 10 having the triangle arrangement of BGR are arranged in multiple rows and multiple columns, the first pixel units 10 in any two adjacent rows are arranged alternately, and the first pixel units 10 in any two adjacent columns are arranged alternately.

Figure 9:
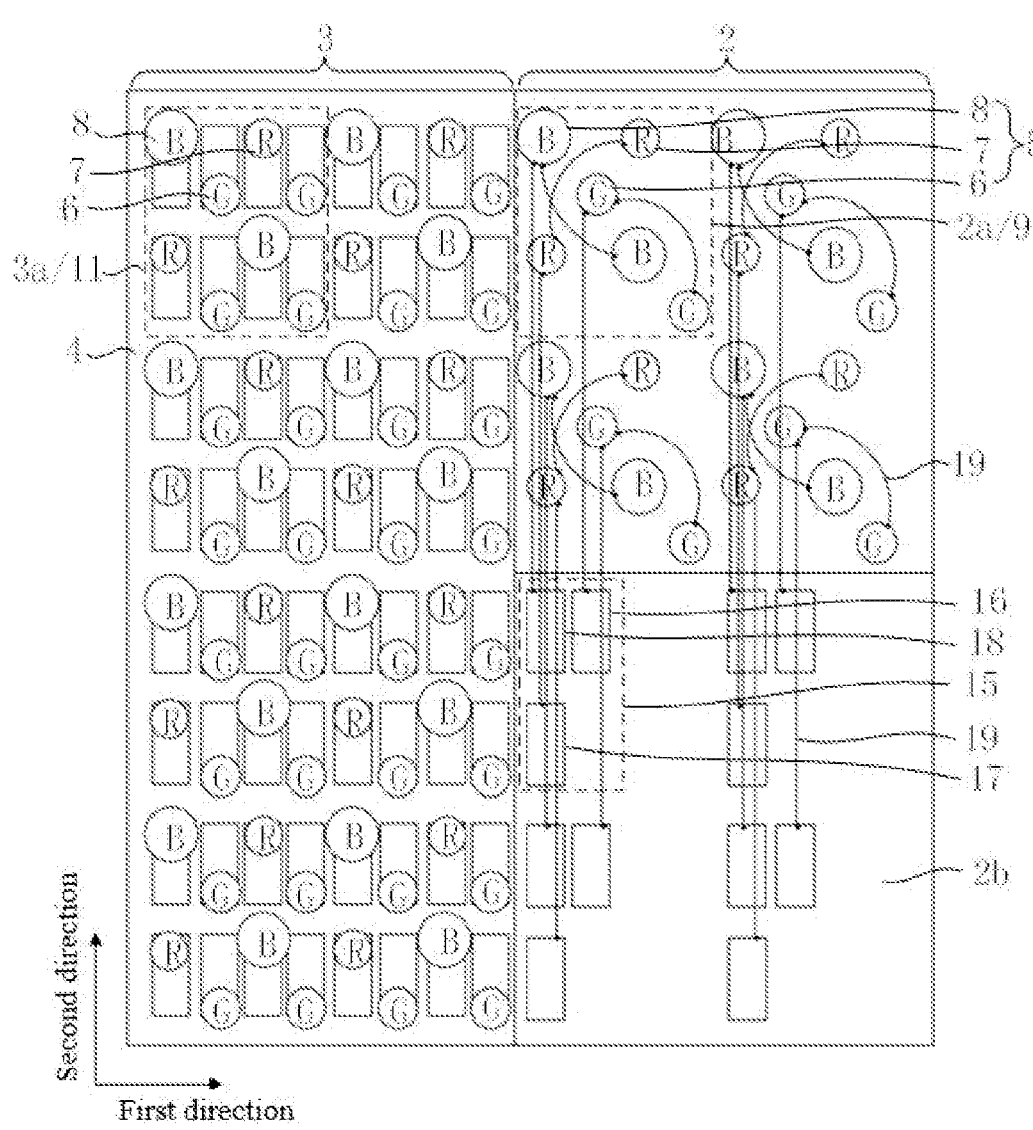
FIG. 9 is a schematic view of a partial structure of a first display area and a second display area of another display panel provided according to an embodiment of the present disclosure.

As illustrated in FIG. 6 and FIG. 9, the first driving circuit 16, the second driving circuit 17, and the third driving circuit 18 in the driving circuit layer in the embodiment of the present disclosure may all adopt one-to-one driving mode or one-to-many driving mode, which will not be repeated here.

The embodiment of the present disclosure has the advantages described in the foregoing embodiments, which will not be repeated here.

Figure 10:
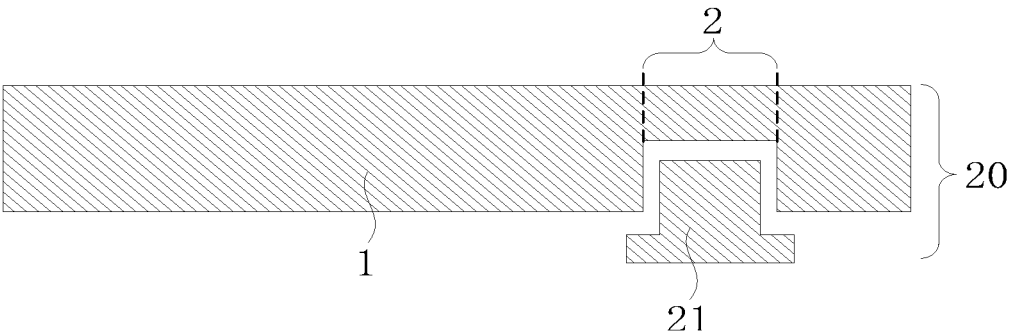
FIG. 10 is a schematic view of a cross-sectional structure of a display device provided according to an embodiment of the present disclosure.

As illustrated in FIG. 10, embodiments of the present disclosure further provide a display device 20, which includes a photosensitive device 21 and the display panel 1 described in the foregoing embodiments. The photosensitive device 21 is disposed corresponding to the first display area 2.

Specifically, the first display area 2 has high light trans-mission and may provide a light path for the photosensitive device.

Specifically, the photosensitive device 21 may include a camera, an optical touch component, a fingerprint recogni-tion sensor, or the like.

In the embodiments of the present disclosure, the diffrac-tion effect of the first display area 2 may be effectively reduced on the basis of ensuring the display effect of the first display area 2, thereby improving the imaging effect of photosensitive device 21.

In the foregoing embodiments, the descriptions of each embodiment have their own emphases, and for parts not described in detail in a certain embodiment, reference may be made to relevant descriptions of other embodiments.

The above is a detailed introduction to the display panels and display devices provided in the embodiments of the present disclosure. In this paper, specific examples are used to illustrate the principles and implementation methods of the present disclosure. The descriptions of the above embodiments are only used to help understand the technical solutions and their core ideas of the present disclosure. Those of ordinary skill in the art should understand that: it is still possible to modify the technical solutions described in the foregoing embodiments or perform equivalent replacements for some of the technical features, and these modifications or replacements do not make the essence of the corresponding technical solutions depart from the scope of the technical solutions of the embodiments of the present disclosure.

The invention claimed is:

1. A display panel, comprising a first display area and a second display area arranged adjacently, a light transmit-tance of the first display area being greater than a light transmittance of the second display area, and further com-prising:

a substrate; and a light-emitting layer, arranged on a side of the substrate, and comprising a plurality of first subpixels displaying a first color and a plurality of second subpixels dis-playing a second color, wherein the first display area comprises a plurality of first sub-display areas, the second display area comprises a plurality of second sub-display areas, and the first sub-display areas and the second sub-display areas are congruent;

a number of the first subpixels located in the first sub-display areas is less than a number of the first subpixels located in the second sub-display areas, an area of each of the first subpixels located in the first sub-display areas is greater than an area of each of the first subpixels located in the second sub-display areas; and a number of the second subpixels located in the first sub-display areas is equal to a number of the second subpixels located in the second sub-display areas.

2. The display panel according to claim 1, wherein an area of each of the second subpixels located in the first sub-display areas is less than or equal to an area of each of the second subpixels located in the second sub-display areas.

3. The display panel according to claim 2, wherein the light-emitting layer further comprises a plurality of third subpixels displaying a third color; a number of the third subpixels located in the first sub-display areas is equal to a number of the third subpixels located in the second sub-display areas; and an area of each of the third subpixels located in the first sub-display areas is less than or equal to an area of each of the third subpixels located in the second sub-display areas.

4. The display panel according to claim 1, wherein a total area of all of the first subpixels located in the first sub-display areas is equal to a total area of all of the first subpixels located in the second sub-display areas.

5. The display panel according to claim 1, wherein central points of the first subpixels are arranged along a first direction and a second direction in the first display area and the second display area, the first direction and the second direction cross each other, and central points of the second subpixels are arranged along the first direction and the second direction in the first display area and the second display area; and wherein in the first direction, a distance between the center points of two adjacent ones of the first subpixels located in the first display area is greater than a distance between the center points of two adjacent ones of the first subpixels located in the second display area, and a distance between the center points of two adjacent ones of the second subpixels located in the first display area is equal to a distance between the center points of two adjacent ones of the second subpixels located in the second display area.

6. The display panel according to claim 5, wherein in the second direction, a distance between the center points of two adjacent ones of the first subpixels located in the first display area is greater than or equal to a distance between the center points of two adjacent ones of the first subpixels located in the second display area, and a distance between the center points of two adjacent ones of the second subpixels located in the first display area is equal to a distance between the center points of two adjacent ones of the second subpixels located in the second display area.

7. The display panel according to claim 6, wherein in the first direction, a ratio of the distance between the center points of two adjacent ones of the first subpixels located in the first display area to the distance between the center points of two adjacent ones of the first subpixels located in the second display area is 2; and in the second direction, a ratio of the distance between the center points of two adjacent ones of the first subpixels located in the first display area to the distance between the center points of two adjacent ones of the first subpixels located in the second display area is 2 or 1.

8. The display panel according to claim 6, wherein the light-emitting layer further comprises a plurality of third subpixels displaying a third color, and central points of the third subpixels are arranged along a first direction and a second direction in the first display area and the second display area;

in the first direction, a distance between the center points of two adjacent ones of the third subpixels located in the first display area is equal to a distance between the center points of two adjacent ones of the third subpixels located in the second display area; and in the second direction, a distance between the center points of two adjacent ones of the third subpixels located in the first display area is equal to a distance between the center points of two adjacent ones of the third subpixels located in the second display area.

9. The display panel according to claim 8, wherein in the first display area, the first subpixels, the second subpixels, and the third subpixels are arranged according to arrangements of REAL RGB; and in the second display area, the first subpixels, the second subpixels, and the third subpixels are arranged according to arrangements of SPR.

10. The display panel according to claim 9, wherein each of the first subpixels comprises a green subpixel, each of the second subpixels comprises a red subpixel or a blue subpixel, and each of the third subpixels comprises a red subpixel or the blue subpixel that is different from the second subpixels.

11. The display panel according to claim 9, further comprising a driving circuit layer arranged between the substrate and the light-emitting layer, wherein the first display area further comprises a transition area adjacent to the first sub-display areas; and the driving circuit layer comprises first driving circuits, second driving circuits, and third driving circuits arranged in the transition area, the first driving circuits are electrically connected to the first subpixels located in the first display area, the second driving circuits are electrically connected to the second subpixels located in the first display area, and the third driving circuits are electrically connected to the third subpixels located in first display area.

12. The display panel according to claim 11, wherein in the first display area, each of the first sub-display areas is provided with a minimum subpixel repeating unit therein, and the minimum subpixel repeating unit comprises two first subpixels of the first subpixels, two second subpixels of the second subpixels, and two third subpixels of the third subpixels; and each of the first driving circuits is correspondingly and electrically connected to the two first subpixels of the minimum subpixel repeating unit, each of the second driving circuits is correspondingly and electrically connected to the two second subpixels of the minimum subpixel repeating unit, and each of the third driving circuits is correspondingly and electrically connected to the two third subpixels of the minimum subpixel repeating unit.

13. A display device, comprising:

a photosensitive device; and a display panel, comprising a first display area and a second display area arranged adjacently, wherein a light transmittance of the first display area is greater than a light transmittance of the second display area, the photosensitive device is arranged corresponding to the first display area, and the display panel further comprises:

a substrate; and a light-emitting layer, arranged on a side of the substrate, and comprising a plurality of first subpixels displaying a first color and a plurality of second subpixels displaying a second color, wherein the first display area comprises a plurality of first sub-display areas, the second display area comprises a plurality of second sub-display areas, and the first sub-display areas and the second sub-display areas are congruent;

a number of the first subpixels located in the first sub-display areas is less than a number of the first subpixels located in the second sub-display areas, an area of each of the first subpixels located in the first sub-display areas is greater than an area of each of the first subpixels located in the second sub-display areas; and a number of the second subpixels located in the first sub-display areas is equal to a number of the second subpixels located in the second sub-display areas.

14. The display device according to claim 13, wherein an area of each of the second subpixels located in the first sub-display areas is less than or equal to an area of each of the second subpixels located in the second sub-display areas.

15. The display device according to claim 14, wherein the light-emitting layer further comprises a plurality of third subpixels displaying a third color; a number of the third subpixels located in the first sub-display areas is equal to a number of the third subpixels located in the second sub-display areas; and an area of each of the third subpixels located in the first sub-display areas is less than or equal to an area of each of the third subpixels located in the second sub-display areas.

16. The display device according to claim 15, wherein in the first display area, the first subpixels, the second subpixels, and the third subpixels are arranged according to arrangements of REAL RGB; and in the second display area, the first subpixels, the second subpixels, and the third subpixels are arranged according to arrangements of SPR.

17. The display device according to claim 16, wherein each of the first subpixels comprises a green subpixel, each of the second subpixels comprises a red subpixel or a blue subpixel, and each of the third subpixels comprises a red subpixel or the blue subpixel that is different from the second subpixels.

18. The display device according to claim 16, wherein the display panel further comprises a driving circuit layer arranged between the substrate and the light-emitting layer;

the first display area further comprises a transition area adjacent to the first sub-display areas; and the driving circuit layer comprises first driving circuits, second driving circuits, and third driving circuits arranged in the transition area, the first driving circuits are electrically connected to the first subpixels located in the first display area, the second driving circuits are electrically connected to the second subpixels located in the first display area, and the third driving circuits are electrically connected to the third subpixels located in first display area.

19. The display device according to claim 18, wherein in the first display area, each of the first sub-display areas is provided with a minimum subpixel repeating unit therein, and the minimum subpixel repeating unit comprises two first subpixels of the first subpixels, two second subpixels of the second subpixels, and two third subpixels of the third subpixels; and each of the first driving circuits is correspondingly and electrically connected to the two first subpixels of the minimum subpixel repeating unit, each of the second driving circuits is correspondingly and electrically connected to the two second subpixels of the minimum subpixel repeating unit, and each of the third driving circuits is correspondingly and electrically connected to the two third subpixels of the minimum subpixel repeating unit.

20. The display device according to claim 13, wherein a total area of all of the first subpixels located in the first sub-display areas is equal to a total area of all of the first subpixels located in the second sub-display areas.

* * * * *